United States Patent
Hori et al.

(10) Patent No.: US 6,303,438 B1
(45) Date of Patent: *Oct. 16, 2001

(54) METHOD FOR MANUFACTURING A NONVOLATILE SEMICONDUCTOR MEMORY DEVICE HAVING INCREASED HOT ELECTRON INJECTION EFFICIENCY

(75) Inventors: Atsushi Hori; Junichi Kato; Shinji Odanaka, all of Osaka (JP); Seiki Ogura, Wappingers Falls, NY (US)

(73) Assignees: Matsushita Electric Industrial Co., Ltd., Osaka (JP); Halo LSI Design and Device Technologies, Inc., Wappingers Falls, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/017,216

(22) Filed: Feb. 2, 1998

(51) Int. Cl.[7] .................................................. H01L 21/336
(52) U.S. Cl. ........................ 438/259; 438/257; 438/266; 438/267
(58) Field of Search ..................... 257/316, 315, 257/314, 317, 321, 324, 322, 326, 371; 365/185.01, 185.26; 438/257, 258, 259, 262, 263, 264, 265, 266, 267, 303, 304, 524, 588, 589, 595, 596, 976, 981

(56) References Cited

U.S. PATENT DOCUMENTS

| 5,157,281 | * | 10/1992 | Santin et al. . | |
| 5,312,781 | * | 5/1994 | Gregor et al. | 438/701 |
| 5,408,130 | * | 4/1995 | Woo et al. | 257/769 |
| 5,502,321 | * | 3/1996 | Matsushita | 257/316 |
| 5,780,341 | | 7/1998 | Ogura . | |
| 5,840,623 | * | 11/1998 | Sahota | 438/624 |
| 5,852,312 | * | 12/1998 | Ahn | 257/321 |
| 6,051,465 | | 4/2000 | Kato et al. . | |
| 6,051,860 | | 4/2000 | Odanaka et al. . | |

FOREIGN PATENT DOCUMENTS

| 8-227944 | 9/1996 | (JP) . |
| 11-220044 | 10/1999 | (JP) . |

OTHER PUBLICATIONS

D. J. Dimaria et al., "Electrically–Alterable Memory Using a Dual Electron Injector Structure", IEEE Electron Device Letters, vol. EDL–1, No. 9, Sep. 1980.*

* cited by examiner

Primary Examiner—Charles Bowers
Assistant Examiner—Jack Chen
(74) Attorney, Agent, or Firm—McDermott, Will & Emery

(57) ABSTRACT

The nonvolatile semiconductor memory device of the present invention includes: a semiconductor substrate having a surface including a first surface region at a first level, a second surface region at a second level lower than the first level, and a step side region linking the first surface region and the second surface region together; a channel region formed in the first surface region of the semiconductor substrate; a source region and a drain region which are formed in the surface of the semiconductor substrate so as to interpose the channel region therebetween; a first insulating film formed on the surface of the semiconductor substrate; a floating gate formed on the first insulating film; and a control gate which is capacitively coupled to the floating gate via a second insulating film. The first insulating film includes a first gate insulating film portion formed in the first surface region, and, a second gate insulating film portion formed in the step side region and the second surface region. The control gate is formed on the first gate insulating film portion. A part of the floating gate faces the step side region via the second gate insulating film portion, and another part of the floating gate is adjacent to the control gate via the second insulating film.

7 Claims, 12 Drawing Sheets

METHOD FOR MANUFACTURING A NONVOLATILE SEMICONDUCTOR MEMORY DEVICE HAVING INCREASED HOT ELECTRON INJECTION EFFICIENCY

BACKGROUND OF THE INVENTION

The present invention relates to a nonvolatile semiconductor memory device and a method for fabricating the same, and a semiconductor integrated circuit.

In recent years, a highly integrated semiconductor memory device (memory LSI) has been increasingly demanded to operate at a higher rate with reduced power consumption. As a highly integrated semiconductor memory device which can electrically write and erase data, a flash EEPROM (electrically erasable programmable read only memory) has been widely used.

FIG. 14D shows the cross section of a conventional flash EEPROM. The flash EEPROM will be described with reference to the method for fabricating the same.

First, as shown in FIG. 14A, after a gate oxide film 102 has been formed by oxidizing the surface of a semiconductor substrate 101, a poly-silicon film 130 including a portion to be a floating gate 103 is deposited thereon. Next, a silicon nitride film 131 is deposited on the poly-silicon film 130, and an opening is provided through a region defining the position and the shape of the floating gate 103 by performing a commonly used photolithography process on the silicon nitride film 131. Next, the exposed surface of the poly-silicon film 130 is selectively oxidized by using the silicon nitride film 131 having such an opening as a mask, thereby forming an oxide film 104 on the poly-silicon film 130.

Next, after the silicon nitride film 131 has been removed, the poly-silicon film 130 is patterned, thereby forming the floating gate 103 as shown in FIG. 14B. The oxide film 104 is formed on the floating gate 103. The film thickness of the peripheral region of the floating gate 103 becomes larger than that of the center region thereof. In other words, the floating gate 103 has a sharpened peripheral region, which shape is affected by a Bird's Peak generated by the formation of the oxide film 104.

Subsequently, as shown in FIG. 14C, the sides of the floating gate 103 are oxidized, thereby forming a second gate oxide film 107. Thereafter, a control gate 109 is formed so as to overlap the floating gate 103.

Finally, as shown in FIG. 14D, impurity ions are implanted into the substrate 101, thereby forming a drain region 112 and a source region 113.

The write of data is performed by accelerating the electrons from the source region 113 by a high electric field formed between the floating gate 103 and the control gate 109 and by injecting the electrons into the floating gate 103. The erasure of data is performed by taking out the electrons, which have been accumulated in the floating gate 103, from the floating gate 103 into the control gate 109 upon the application of a positive voltage to the control gate 109. Since the peripheral region of the floating gate 103 has a sharpened shape as described above, the electric field is concentrated in the peripheral region. Thus, the electrons can be taken out more easily.

However, the above-described structure has the following problems.

First, the flash EEPROM has a problem in that the data write speed thereof is lower than that of a DRAM by two orders of magnitude. Such a low data write speed necessarily requires increasing the voltages (i.e., a drain voltage and a gate voltage) for writing data. As a result, the circuit configuration and the fabrication process thereof are complicated. In other words, it is very difficult to improve both a write speed and write voltages. This is because, in order to increase such a very low write speed, there is no other means than setting the voltages at high values. For example, when a control gate voltage is set at about 9 V and a drain voltage is set at about 4.5 V for writing data, a write time, required for varying an inverted voltage necessary for reading, should be at least as long as 10 μs.

One of the reasons for such a long write time is poor efficiency with which channel hot electrons are injected into the floating gate. In writing data, in a conventional flash EEPROM, the channel hot electrons are scattered to be oriented in all the directions. However, since an electric field is applied in the direction from the source toward the drain, the velocities of the channel hot electrons are accelerated in this direction. Since the floating gate is not located in this direction of the velocity vectors of the channel hot electrons, the resulting injection efficiency and the resulting write efficiency are far from being satisfactory. Consequently, it has been impossible to meet the demand for increasing a write speed and for decreasing write voltages.

In addition, the device shown in FIG. 14D increases data erasure (electron takeout) efficiency by sharpening the peripheral region of the floating gate 103. According to such a method, the efficiency is surely increased, but the region, from which the electrons are taken out, is adversely restricted to a narrow area. As a result, the current density is undesirably increased in such an area and the oxide film is more likely to be damaged.

Furthermore, in the prior art, if a mask cannot be satisfactorily aligned with the control gate 109 during the patterning of the control gate 109, then the positional relationship between the control gate 109 and the floating gate 103 is varied. As a result, an effective channel length cannot be precisely defined, thereby causing a large variation in resulting electric characteristics.

SUMMARY OF THE INVENTION

The nonvolatile semiconductor memory device of the present invention includes: a semiconductor substrate having a surface including a first surface region at a first level, a second surface region at a second level lower than the first level, and a step side region linking the first surface region and the second surface region together; a channel region formed in the first surface region of the semiconductor substrate; a source region and a drain region which are formed in the surface of the semiconductor substrate so as to interpose the channel region therebetween; a first insulating film formed on the surface of the semiconductor substrate; a floating gate formed on the first insulating film; and a control gate which is capacitively coupled to the floating gate via a second insulating film. The first insulating film includes a first gate insulating film portion formed in the first surface region, and a second gate insulating film portion formed in the step side region and the second surface region. The control gate is formed on the first gate insulating film portion. A part of the floating gate faces the step side region via the second gate insulating film portion, and another part of the floating gate is adjacent to the control gate via the second insulating film.

A method for fabricating the nonvolatile semiconductor memory device of the present invention includes the steps of: forming an insulating film including a portion functioning as a first gate insulating film on a semiconductor substrate; forming a control gate on the portion of the insulating film functioning as the first gate insulating film; forming a capacitive insulating film on surfaces of the control gate; covering the capacitive insulating film, which is located on sides of the control gate, with side walls; partially etching the insulating film and a surface of the semiconductor substrate by using the control gate and the side walls as a mask, thereby forming a concave portion in the surface of the semiconductor substrate; forming a second gate insulating film in the concave portion; selectively removing the side walls; and forming a floating gate having a surface facing one of the sides of the control gate via the capacitive insulating film and having a surface facing a side of the concave portion of the semiconductor substrate via the second gate insulating film.

Another alternative method for fabricating the nonvolatile semiconductor memory device of the present invention includes the steps of: forming an insulating film including a portion functioning as a first gate insulating film on a semiconductor substrate; forming a control gate on the portion of the insulating film functioning as the first gate insulating film; covering sides of the control gate with side walls; partially etching the insulating film and a surface of the semiconductor substrate by using the control gate and the side walls as a mask, thereby forming a concave portion in the surface of the semiconductor substrate; selectively removing the side walls; forming a capacitive insulating film on the sides of the control gate, and forming a second gate insulating. film in the concave portion; and forming a floating gate. having a surface facing one of the sides of the control gate via the capacitive insulating film and having a surface facing a side of the concave portion of the semiconductor substrate via the second gate insulating film.

The semiconductor integrated circuit of the present invention includes: a plurality of nonvolatile memory cells; a semiconductor substrate having a surface including a first surface region at a first level, a second surface region at a second level lower than the first level, and a step side region linking the first surface region and the second surface region together; and a driver circuit, formed on the semiconductor substrate, for driving the plurality of nonvolatile memory cells. Each of the plurality of nonvolatile memory cells is a nonvolatile semiconductor memory device including: a channel region formed in the first surface region of the semiconductor substrate; a source region and a drain region which are formed in the surface of the semiconductor substrate so as to interpose the channel region therebetween; a first insulating film formed on the surface of the semiconductor substrate; a floating gate formed on the first insulating film; and a control gate which is capacitively coupled to the floating gate via a second insulating film. The first insulating film includes a first gate insulating film portion formed in the first surface region, and a second gate insulating film portion formed in the step side region and the second surface region. The control gate is formed on the first gate insulating film portion. A part of the floating gate faces the step side region via the second gate insulating film portion, and another part of the floating gate is adjacent to the control gate via the second insulating film.

Thus, the invention described herein makes possible the advantages of (1) providing a nonvolatile semiconductor memory device which can increase hot electron injection efficiency, increase a write speed or decrease write voltages, precisely define an effective channel length and suppress the variation in electric characteristics thereof, (2) providing a method for fabricating such a nonvolatile semiconductor memory device, and (3) providing a semiconductor integrated circuit including such a nonvolatile semiconductor memory device.

These and other advantages of the present invention will become apparent to those skilled in the art upon reading and understanding the following detailed description with reference to the accompanying figures.

DESCRIPTION OF THE PREFERRED EMBODIMENTS

Hereinafter, embodiments of the present invention will be described with reference to the accompanying drawings.

Embodiment 1

Figure 1A:
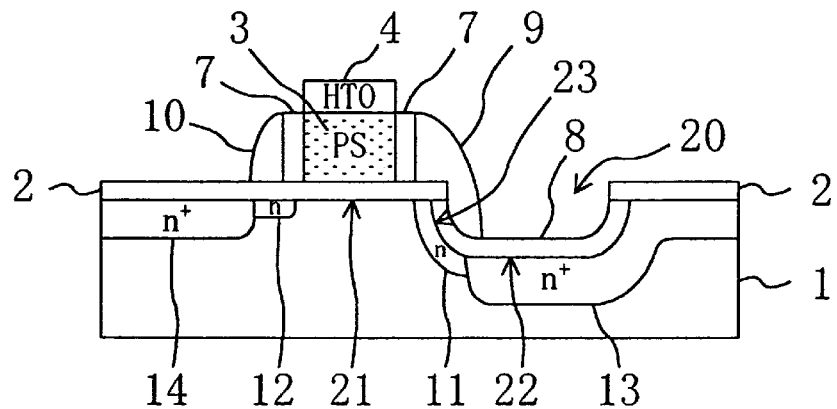
FIG. 1A is a cross-sectional view of a nonvolatile semiconductor memory device in the first embodiment of the present invention and FIG. 1B is a plan view thereof.
Figure 1B:
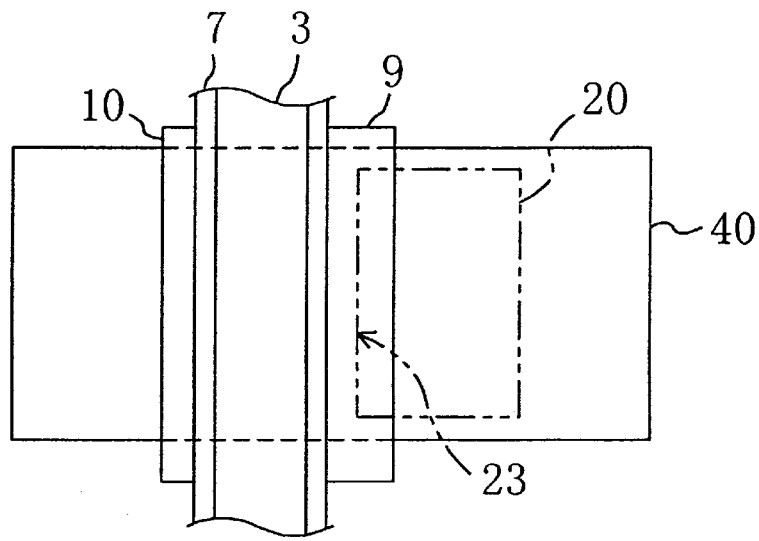

FIG. 1A shows the cross section of the nonvolatile semiconductor memory device in this embodiment of the present invention, and FIG. 1B shows the planar layout thereof. The device of this embodiment is an n-channel MOS flash EEPROM.

As shown in FIG. 1A, the nonvolatile semiconductor memory device of this embodiment includes a semiconductor substrate (p-type silicon substrate) 1 with a step formed in the surface thereof. The surface of the substrate 1 is divided by this step into a surface region at a relatively high level (first surface region) 21 and a surface region at a relatively low level (second surface region) 22. The second surface region 22 corresponds to the bottom of a concave portion formed in the surface of the substrate 1. The level difference (i.e., the height of the step) between the first surface region 21 and the second surface region 22 is, for example, in the range from about 50 nm to about 70 nm.

In this specification, the surface region between the first surface region 21 and the second surface region 22 will be referred to as a "step side region" 23. The first surface region 21 and the second surface region 22 are linked together by the step side region 23. In the cross-sectional view shown in FIG. 1A, the step side region 23 is drawn as being a surface having a curvature. Alternatively, the step side region 23 may be a plane formed to be substantially vertical with respect to the second surface region 22.

A first gate insulating film 2 is formed in the first surface region 21 in the surface of the semiconductor substrate 1, and a control gate 3 is formed on the first gate insulating film 2. The upper surface of the control gate 3 is covered with an insulating cap 4 made of high temperature oxide (HTO), and the sides thereof are covered with a capacitive insulating film 7. It is noted that the control gate 3 may be connected to a word line, or the control gate 3 itself may function as a word line.

On the other hand, a second gate insulating film 8 functioning as a tunnel oxide film is formed in the step side region 23 and the second surface region 22. In this specification, the first gate insulating film 2 and the second gate insulating film 8 formed in the surface of the substrate 1 as a whole will sometimes be referred to as a "first insulating film" and the capacitive insulating film 7 will sometimes be referred to as a "second insulating film".

A floating gate 9, which is capacitively coupled to the control gate 3 via the capacitive insulating film 7, is formed so as to cover one side of the control gate 3 and the step side region 23 of the substrate 1. The shape of the floating gate 9 looks alike a side wall spacer of a gate electrode. Though a common side wall spacer is made of an insulating material, the floating gate 9 is made of a conductive material. In such a configuration, a part of the floating gate 9 faces the step side region 23 via the second gate insulating film 8 and another part of the floating gate 9 faces the side of the control gate 3 via the capacitive insulating film 7. A conductive side wall 10 is formed on the other side of the control gate 3.

The drain region includes a low-concentration impurity layer 11 formed in the step side region 23 and a high-concentration impurity layer 13 formed in the second surface region 22. In this specification, the low-concentration impurity layer 11 of the drain region will be called a "low-concentration drain region" and the high-concentration impurity layer 13 thereof will be called a "high-concentration drain regions". The high-concentration drain region 13 may extend from the second surface region 22 through the step side region 23 to reach the surface region at an equal level to that of the first surface region 21 as shown in FIG. 1A, or may be entirely included in the second surface region 22.

The source region formed in the first surface region 21 includes a low-concentration impurity layer 12 formed below the conductive side wall 10 and a high-concentration impurity layer 14 connected to the low-concentration impurity layer 12. In this specification, the low-concentration impurity layer 12 of the source region will be called a "low-concentration source region" and the high-concentration impurity layer 14 thereof will be called a "high-concentration source region". A channel region is formed between the low-concentration drain region 11 and the low-concentration source region 12.

FIG. 1B shows the planar layout of the device shown in FIG. 1A. The device shown in FIG. 1B is electrically isolated by an element isolation layer from the other adjacent devices (not shown). The region surrounded by the element isolation layer will be called an active region 40. The concave portion 20 is formed inside the active region 40. In the layout shown in FIG. 1B, the control gate 3 also functions as a word line and is connected to a plurality of nonvolatile semiconductor memory devices (nonvolatile memory cells). In contrast, the floating gates 9 are isolated from each other for the respective cells. As can be seen from FIG. 1B, the floating gate 9 is formed so as to overlap the step side region 23.

Next, a method for fabricating the nonvolatile semiconductor memory device of this embodiment will be described with reference to FIGS. 2A to 2D and FIGS. 3A to 3D.

Figure 2A:
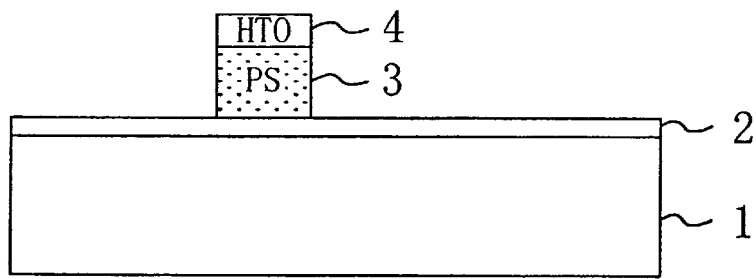
FIGS. 2A to 2D are cross-sectional views showing the respective process steps for fabricating the nonvolatile semiconductor memory device in the first embodiment of the present invention.

First, as shown in FIG. 2A, the surface of the semiconductor substrate 1 made of p-type single crystalline silicon is thermally oxidized, thereby forming an insulating film having a thickness of about 13 nm to about 17 nm on the surface of the semiconductor substrate 1. This insulating film is an insulating film including a portion ultimately functioning as the first gate insulating film 2. Next, after a poly-silicon thin film and a silicon oxide film (HTO film) are deposited by performing a CVD method, the poly-silicon thin film and the silicon oxide film are patterned by utilizing a known lithography technique and a known dry etching technique, thereby forming the control gate 3 made of poly-silicon. The upper surface of the control gate 3 is covered with the insulating cap 4 of the HTO film.

Figure 2B:
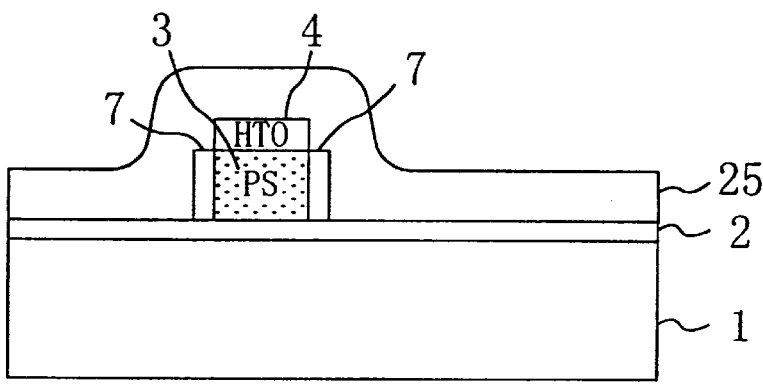

Next, as shown in FIG. 2B, the sides of the control gate 3 are oxidized, thereby forming the capacitive insulating film 7 having a thickness of about 18 nm to about 24 nm on the sides of the control gate 3. Thereafter, a BPSG film 25 having a thickness of about 40 nm to about 70 nm is deposited over the entire surface of the substrate 1.

Figure 2C:
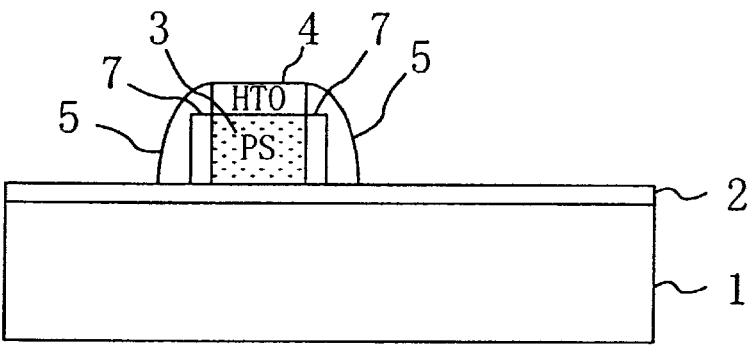

Then, the BPSG film 25 is etched back from the surface thereof by utilizing an anisotropic etching technique, thereby forming side walls 5 of the BPSG film on the sidewall portions of the control gate 3 as shown in FIG. 2C. The thickness of the BPSG side walls 5 (i.e., the size measured in the direction vertical to the sides of the control gate 3) is in the range from about 30 nm to about 60 nm. This size can be controlled in accordance with the thickness of the BPSG film 25 to be deposited.

Figure 2D:
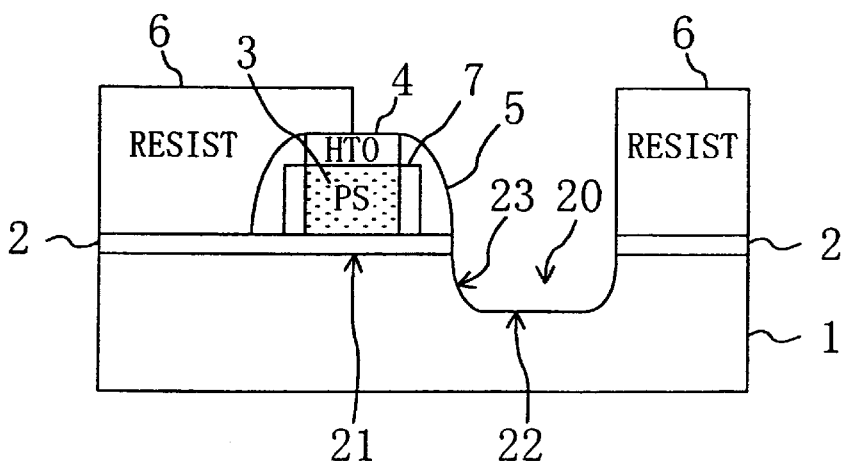

Next, as shown in FIG. 2D, a resist mask 6 is formed over the substrate 1 by utilizing a known lithography technique. Thereafter, by using the resist mask 6, the insulating cap 4 on the control gate 3 and the BPSG side wall 5 as a mask, the surface of the substrate 1 is partially etched, thereby forming a concave portion 20 having a depth of about 30 nm to about 50 nm in the surface of the substrate 1. By forming this concave portion 20, the surface of the substrate 1 is divided into the first surface region 21, the second surface region 22 and the step side region 23. It is noted that the insulating cap 4 on the control gate 3 protects the control gate 3 when the substrate 1 is etched.

Next, the BPSG side walls 5 are selectively removed by using vapor HF, thereby forming the structure shown in FIG.

3A. Since the etching rate of the BPSG film by using vapor HF is 100 times or more as high as the etching rate of a thermally oxidized film (second gate oxide film), the capacitive insulating film 7 is hardly etched.

Subsequently, the surface of the substrate I is thermally oxidized, thereby forming the second gate insulating film 8 having a thickness of about 7 nm to about 10 nm inside the concave portion 20 (i.e., in the second surface region 22 and the step side region 23).

Figure 3A:
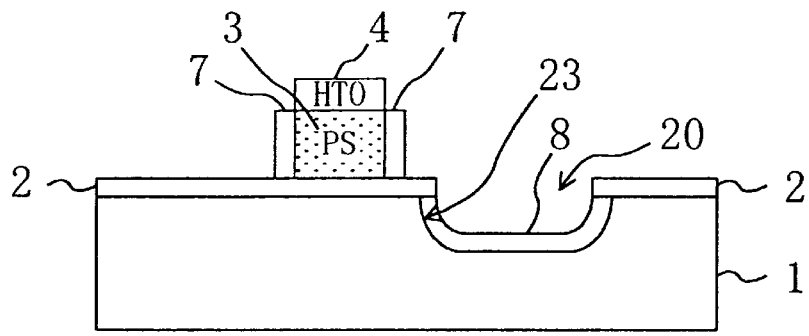
FIGS. 3A to 3D are cross-sectional views showing the respective process steps for fabricating the nonvolatile semiconductor memory device in the first embodiment of the present invention.
Figure 3B:
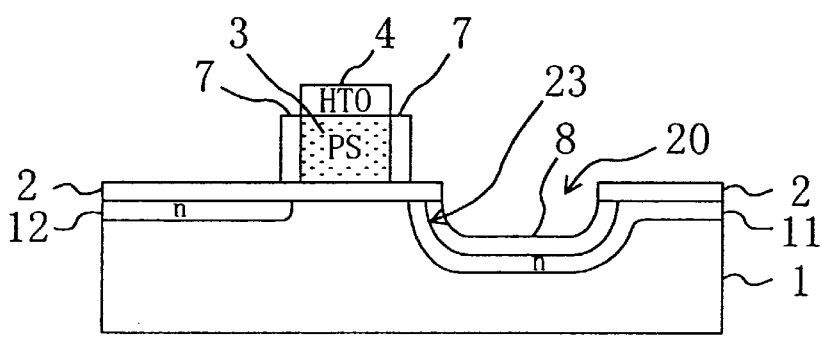
Figure 3C:
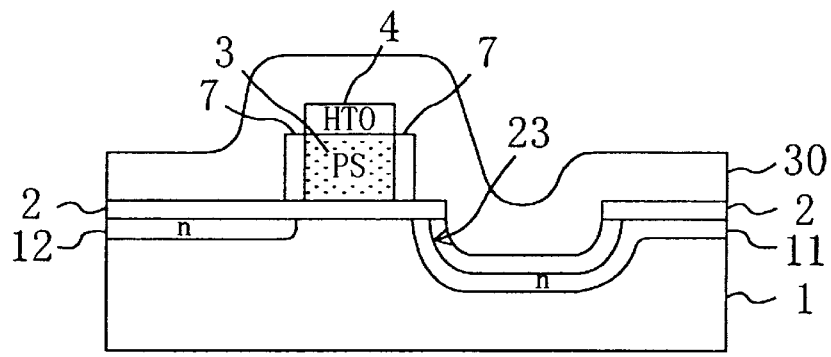
Figure 3D:
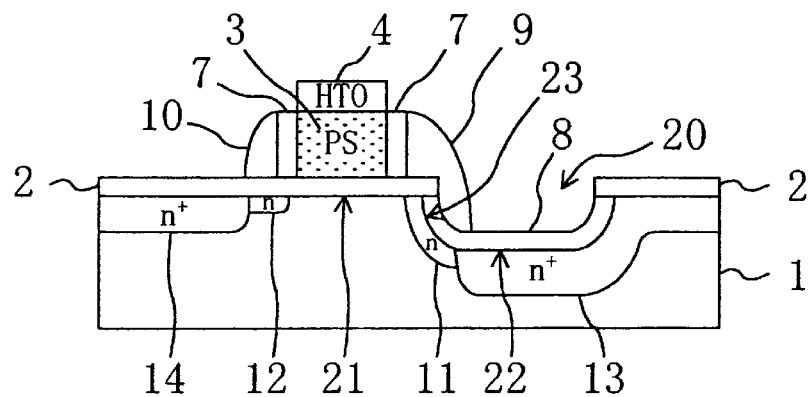

Then, n-type impurity ions are implanted into the surface of the substrate 1, thereby forming an impurity diffusion layer including a part to function as the low-concentration drain region 11 and a part to function as the low-concentration source region 12, as shown in FIG. 3B. Thereafter, as shown in FIG. 3C, a poly-silicon film 30 having a thickness of about 150 nm to about 200 nm is deposited over the entire surface of the substrate 1 and then etched back from the surface thereof. Next, as shown in FIG. 3D, by performing this etch-back process step, the poly-silicon film 30 is partially left on the side wall portions of the control gate 3, thereby forming a sidewall-shaped floating gate 9. In this process step, a conductive side wall 10 is simultaneously formed with the floating gate 9. However, the conductive side wall 10 does not have particular effect on the operation of the nonvolatile memory.

Finally, by using the control gate 3, the floating gate 9 and the insulating side wall 10 as an implantation mask, arsenic ions are implanted into the surface of the substrate 1, thereby forming n-type high-concentration impurity layers 13 and 14 in the substrate 1. As described above, the high-concentration impurity layer 13 becomes the high-concentration drain region and the high-concentration impurity layer 14 becomes the high-concentration source region.

In this fabrication method, the BPSG side walls 5 are used for protecting the capacitive insulating film 7 during the etching of the silicon substrate 1. Since the BPSG side walls can be removed by vapor HF and the etching selectivity thereof with respect to a common thermally oxidized film can be set at a very high value such as 100 or more, the BPSG side walls 5 are preferable as a temporary protective film for the capacitive insulating film 7. Alternatively, the side walls 5 may be made of silicon nitride ($SiN_x$), not BPSG. In such a case, the $SiN_x$ side walls 5 may be selectively removed by phosphoric acid.

The position of the step side region 23 has been shifted from the edge of the control gate 3 by the thickness of the capacitive insulating film 7 and the thickness of the BPSG side wall 5, and is self aligned with respect to the control gate 3. Both the thickness of the capacitive insulating film 7 and the thickness of the BPSG side wall 5 can be controlled with a precision higher than the mask alignment precision. Thus, the distance (gap) between the step side region 23 and the edge of the control gate 3 can be controlled with a high precision. This gap is an important parameter determining the write characteristics of a nonvolatile memory. A device in which the gap can be controlled with high precision and satisfactory reproducibility can be provided by this fabrication method.

In addition, in this fabrication method, the floating gate 9 is formed so as to be self-aligned with respect to the control gate 3. The position of the floating gate 9 is self-aligned with respect to the control gate 3. As described above, since the step side region 23 is also self-aligned with respect to the control gate 3, the positional relationship between the floating gate 9 and the step side region 23 can also be controlled with high precision and satisfactory reproducibility.

In this device, in writing data, a voltage of about 0 V is applied to the source region 14, a voltage of about 5 V is applied to the drain region 13 and a voltage of about 10 V is applied to the control gate 3. The potential of the floating gate 9 becomes about 5 V. As a result, channel hot electrons are generated in the vicinity of the drain. The channel hot electrons are oriented to all the directions because of the scattering. However, since an electric field is applied between the source and the drain, the velocities of the hot electrons moving from the source region to the drain region are accelerated. In this structure of this embodiment, since the floating gate 9 is located in the directions of the velocity vectors of the channel hot electrons, the electron injection efficiency can be considerably increased.

Moreover, since the control gate 3 and the floating gate 9 are laterally adjacent to each other via a thin capacitive insulating film 7, the potential slope (electric field intensity) within the channel region show a very abrupt peak under the region between the control gate 3 and the floating gate 9. The energy of the electrons within the channel region is considerably increased by this high electric field, so that the injection efficiency is further increased. Moreover, since the distance (gap) between the edge of the control gate 3 and the step side region 23 is small, the peak of the electric field is located closer to the step side region 23, which further increases the injection efficiency.

As can be understood, since the injection efficiency is considerably increased in this embodiment, the write time can be remarkably shortened and the write voltages can be lowered.

Embodiment 2

Next, the second embodiment of the present invention will be described.

Figure 4:
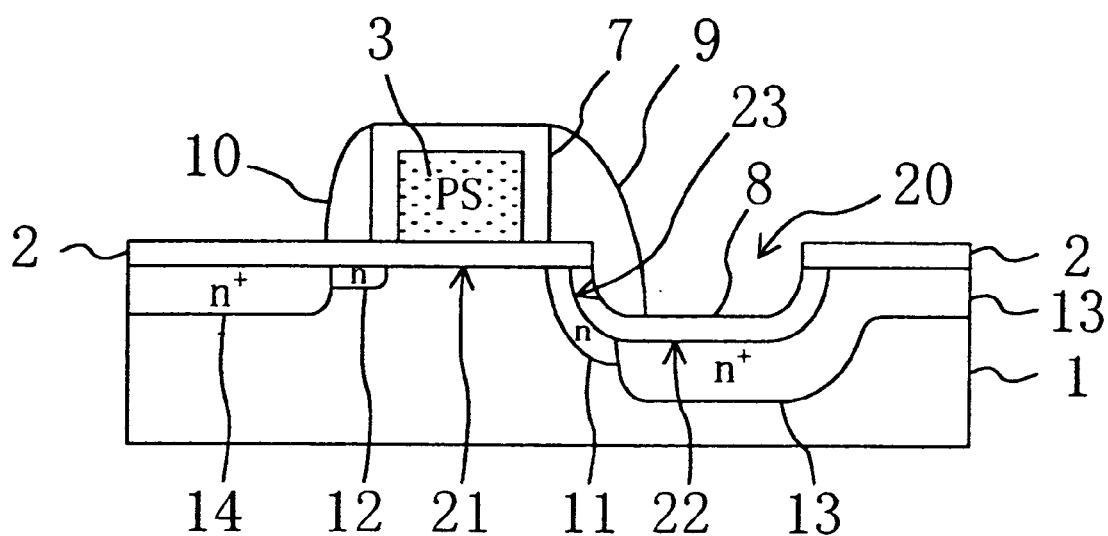
FIG. 4 is a cross-sectional view of a nonvolatile semiconductor memory device in the second embodiment of the present invention.

FIG. 4 shows the cross section of the nonvolatile semiconductor memory device of this embodiment. The device of this embodiment is different from the device of the first embodiment in that the capacitive insulating film 7 covers not only the s ides of the control gate 3 but also the upper surface thereof, and that the insulating cap 4 made of HTO is not provided. In the other respects, the structure of this embodiment is the same as that of the first embodiment. Thus, the description of the common components of these embodiments will be omitted herein.

Hereinafter, a method for fabricating the device shown in FIG. 4 will be described with reference to FIGS. 5A to 5C and FIGS. 6A and 6B.

First, as shown in FIG. 2A, the surface of the semiconductor substrate 1 made of p-type single crystalline silicon is thermally oxidized, thereby forming an insulating film having a thickness of about 13 nm to about 17 nm on the surface of the semiconductor substrate 1. This insulating film is an insulating film including a portion ultimately functioning as the first gate insulating film 2. Next, after a poly-silicon thin film has been deposited by performing a CVD method, the poly-silicon thin film is patterned by utilizing a known lithography technique and a known dry etching technique, thereby forming the control gate 3 made of poly-silicon. Next, the surfaces (i.e., the sides and the upper surface) of the control gate 3 are oxidized, thereby forming the capacitive insulating film 7 having a thickness of about 18 nm to about 24 nm on the sides and the upper surface of the control gate 3.

Figure 5A:
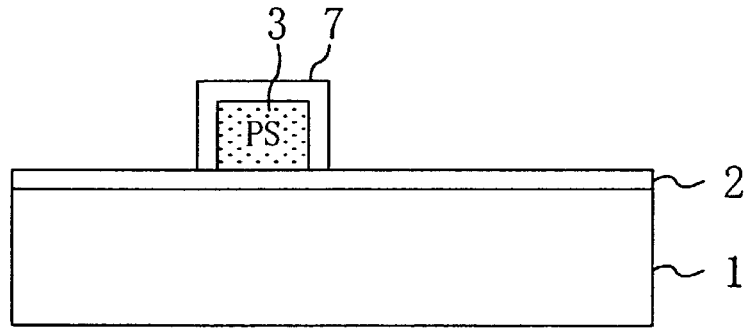
FIG. 5A to 5C are cross-sectional views showing the respective process steps for fabricating the nonvolatile semiconductor memory device in the second embodiment of the present invention.
Figure 5B:
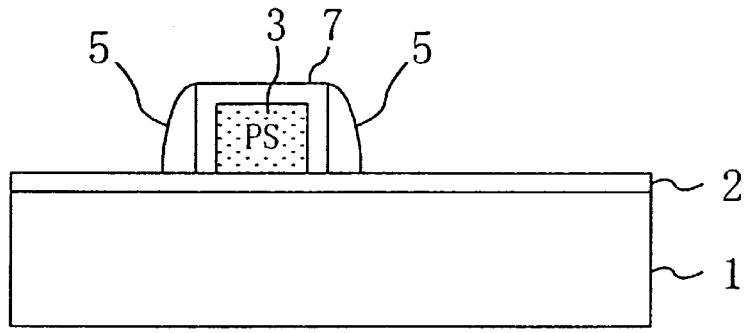

Thereafter, a BPSG film having a thickness of about 30 nm to about 70 nm is deposited over the entire surface of the substrate 1. Then, the BPSG film is etched back from the surface thereof, thereby forming side walls 5 of the BPSG film on the sidewall portions of the control gate 3 as shown in FIG. 5B. The thickness of the BPSG side walls 5 (i.e., the size measured in the direction vertical to the sides of the control gate 3) is in the range from about 30 nm to about 60 nm.

Figure 5C:
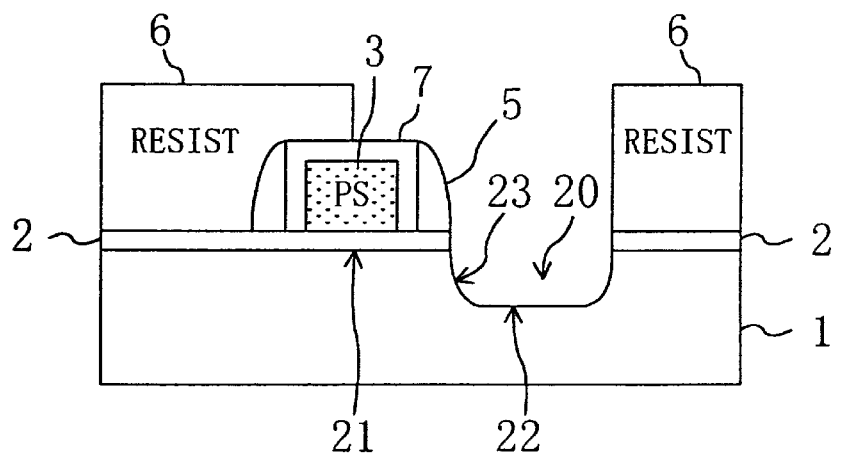

Next, as shown in FIG. 5C, a resist mask 6 is formed over the substrate 1 by utilizing a known lithography technique. Thereafter, by using the resist mask 6, the capacitive insulating film 7 on the control gate 3 and the BPSG side wall 5 as a mask, the surface of the substrate 1 is partially etched, thereby forming a concave portion 20 having a depth of about 30 nm to about 50 nm in the surface of the substrate 1. By forming this concave portion 20, the surface of the substrate 1 is divided into the first surface region 21, the second surface region 22 and the step side region 23.

Figure 6A:
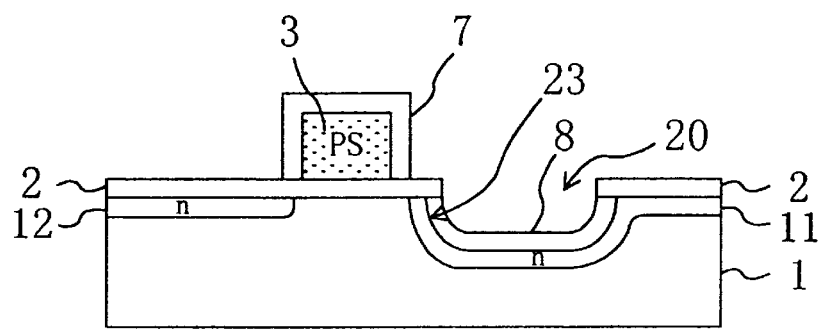
FIGS. 6A and 6B are cross-sectional views showing the respective process steps for fabricating the nonvolatile semiconductor memory device in the second embodiment of the present invention.
Figure 6B:
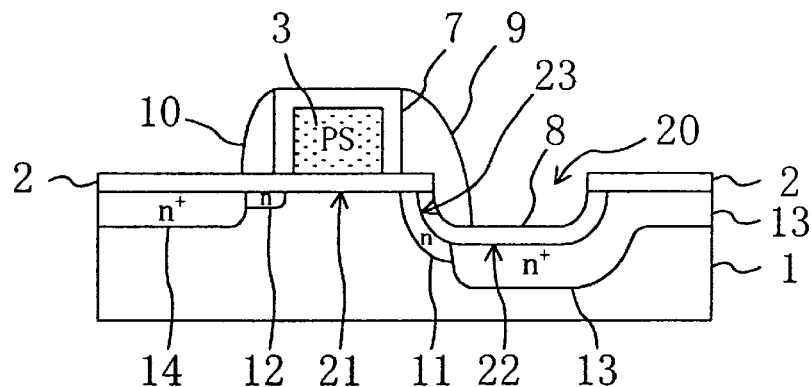

Next, the BPSG side walls 5 are selectively removed by using vapor HF, thereby forming the structure shown in FIG. 6A. As described above, since the etching rate of the BPSG film by using vapor HF is 100 times or more as high as the etching rate of a thermally oxidized film (second gate oxide film), the capacitive insulating film 7 is hardly etched.

Subsequently, the surface of the substrate 1 is thermally oxidized, thereby forming the second gate insulating film 8 having a thickness of about 7 nm to about 10 nm inside the concave portion 20 (i.e., in the second surface region 22 and the step side region 23). Then, n-type impurity ions are implanted into the surface of the substrate 1, thereby forming an n-type impurity diffusion layer including a part to function as the low-concentration drain region 11 and a part to function as the low-concentration source region 12. Thereafter, a poly-silicon film having a thickness of about 150 nm to about 200 nm is deposited over the entire surface of the substrate 1 and then etched back from the surface thereof. By performing this etch-back process step, the poly-silicon film is partially left on the side wall portions of the control gate 3, thereby forming a sidewall-shaped floating gate 9 shown in FIG. 6B. In this process step, a conductive side wall 10 is simultaneously formed with the floating gate 9. However, the conductive side wall 10 does not have particular effect on the operation of the nonvolatile memory.

Finally, by using the control gate 3, the floating gate 9 and the insulating side wall 10 as an implantation mask, arsenic ions are implanted into the surface of the substrate 1, thereby forming n-type high-concentration impurity layers 13 and 14 in the silicon substrate. As described above, the high-concentration impurity layer 13 becomes the high-concentration drain region and the high-concentration impurity layer 14 becomes the high-concentration source region.

In the fabrication method of this embodiment, the capacitive insulating film 7 formed on the control gate 3 protects the control gate 3 when the silicon substrate 1 is etched. Since the number of process steps required in this embodiment is smaller than that of the fabrication method of the first embodiment, the process costs can be reduced.

Embodiment 3

Next, another method for fabricating the device shown in FIG. 1A and 1B will be described with reference to FIGS. 7A to 7C and FIGS. 8A and 8B.

Figure 7A:
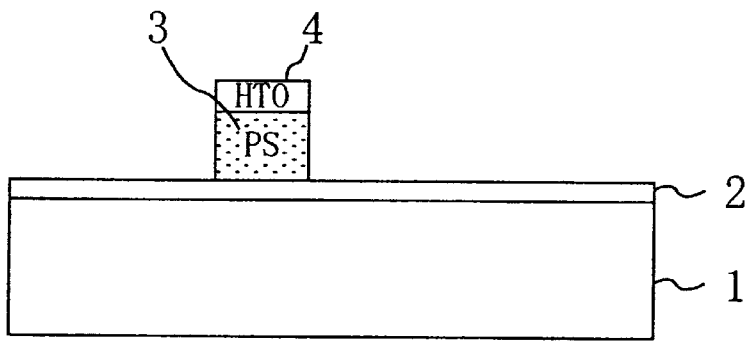
FIGS. 7A to 7C are cross-sectional views showing the respective process steps for fabricating a nonvolatile semiconductor memory device in the third embodiment of the present invention.

First, as shown in FIG. 7A, the surface of the semiconductor substrate 1 made of p-type single crystalline silicon is thermally oxidized, thereby forming an insulating film having a thickness of about 13 nm to about 17 nm on the surface of the semiconductor substrate 1. This insulating film is an insulating film including a portion (first insulating film) ultimately functioning as the first gate insulating film 2. Next, after a poly-silicon thin film and a silicon oxide film (HTO film) have been deposited by performing a CVD method, the poly-silicon thin film and the silicon oxide film are patterned by utilizing a known lithography technique and a known dry etching technique, thereby forming the control gate 3 made of poly-silicon. The upper surface of the control gate 3 is covered with an insulating cap 4 of an HTO film. In this embodiment, the capacitive insulating film 7 is not formed on this stage.

Figure 7B:
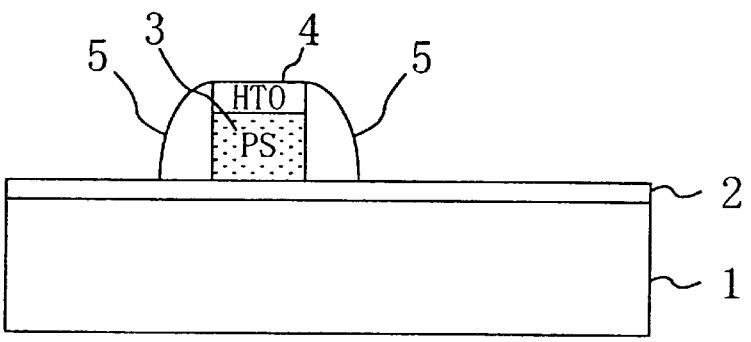

Next, as shown in FIG. 7B, before the capacitive insulating film is formed on the sides of the control gate 3, side walls 5 made of BPSG are formed on the sidewall portions of the control gate 3. The thickness of the BPSG side walls 5 (i.e., the size measured in the direction vertical to the sides of the control gate 3) is in the range from about 30 nm to about 60 nm.

Figure 7C:
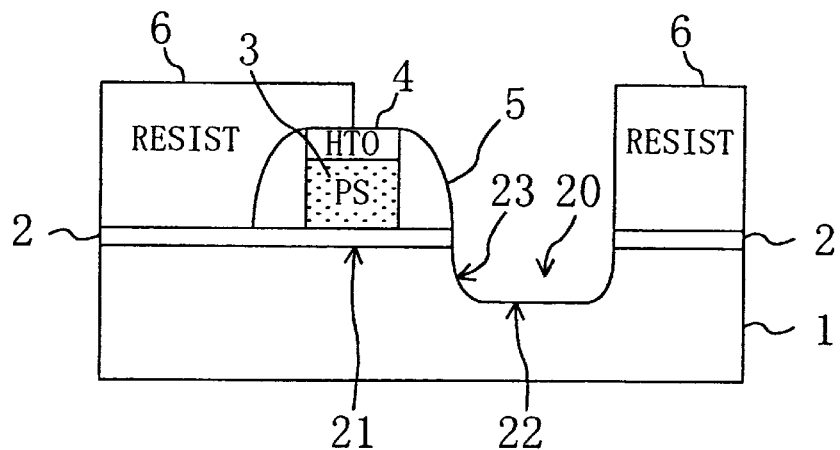

Subsequently, as shown in FIG. 7C, a resist mask 6 is formed by utilizing a known lithography technique over the substrate 1. Thereafter, by using the resist mask 6, the insulating cap 4 on the control gate 3 and the BPSG side wall 5 as a mask, the surface of the substrate 1 is partially etched, thereby forming a concave portion 20 having a depth of about 30 nm to about 50 nm in the surface of the substrate 1. By forming this concave portion 20, the surface of the substrate 1 is divided into the first surface region 21, the second surface region 22 and the step side region 23. It is noted that the insulating cap 4 on the control gate 3 protects the control gate 3 when the substrate 1 is etched.

Next, the BPSG side walls 5 are selectively removed by using vapor HF. In this embodiment, since the capacitive insulating film 7 does not exist between the side walls 5 and the control gate 5, the etching rate of the side walls 5 need not be set at a value far larger than that of the capacitive insulating film 7. However, since it is preferable that the other oxide films such as the element isolation layer are not etched if possible, BPSG is preferable as the material for the side walls 5 in this case, too.

Next, the sides of the control gate 3 and the surface of the substrate 1 are thermally oxidized at the same time, thereby forming the capacitive insulating film 7 having a thickness of about 14 nm to about 20 nm on the sides of the control gate 3 and forming the second gate insulating film 8 having a thickness of about 7 nm to about 10 nm inside the concave portion 20 (i.e., in the second surface region 22 and the step side region 23). In the case where the control gate 3 is made of poly-silicon doped with high-concentration phosphorous (concentration of phosphorous: about $2 \times 10^{20}$ cm$^{-3}$), the thickness of the capacitive insulating film 7 becomes about twice as large as that of the second gate insulating film 8. Then, n-type impurity ions are implanted into the surface of the substrate 1, thereby forming an impurity diffusion layer including a part to function as the low-concentration drain region 11 and a part to function as the low-concentration source region 12.

Figure 8:
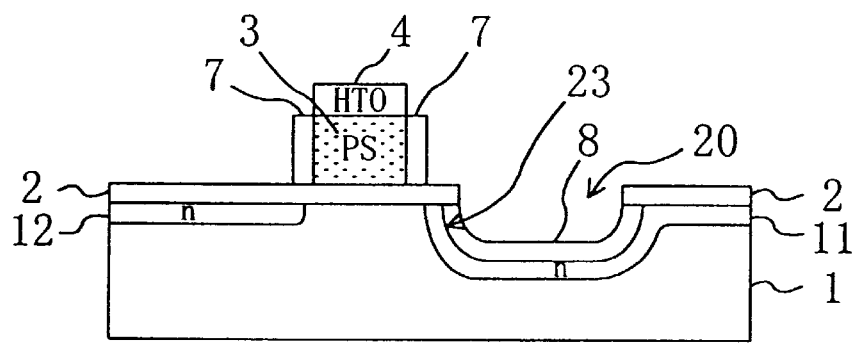
FIGS. 8A and 8B are cross-sectional views showing the respective process steps for fabricating a nonvolatile semiconductor memory device in the third embodiment of the present invention.
Figure 8:
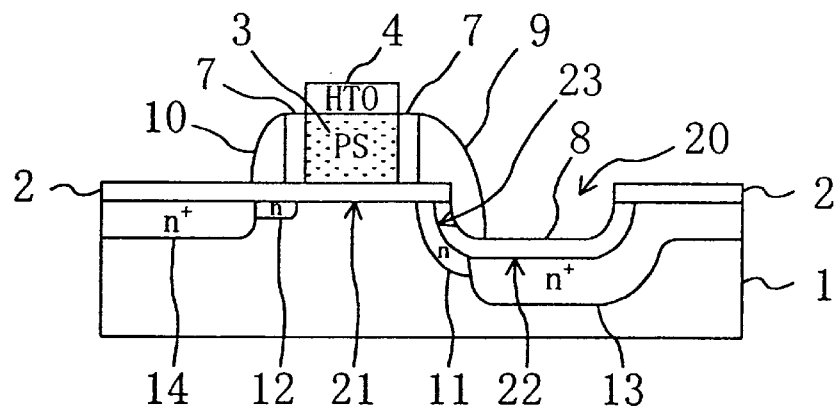

Thereafter, as shown in FIG. 8B, a sidewall-shaped floating gate 9 of a poly-silicon film is formed. In this process step, a conductive side wall 10 is simultaneously formed with the floating gate 9. However, the conductive side wall 10 does not have particular effect on the operation of the nonvolatile memory. Finally, by using the control gate 3, the floating gate 9 and the insulating side wall 10 as an implantation mask, arsenic ions are implanted into the surface of the substrate 1, thereby forming n-type high-concentration impurity layers 13 and 14 in the silicon substrate. As described above, the high-concentration impurity layer 13 becomes the high-concentration drain region and the high-concentration impurity layer 14 becomes the high-concentration source region.

In this fabrication method, since the capacitive insulating film 7 and the second gate insulating film 8 are simultaneously formed, the number of necessary process steps is decreased and the fabrication costs are reduced. In addition, since the capacitive insulating film 7 has not been formed yet when the BPSG side walls 5 are selectively removed, there is no possibility that the capacitive insulating film 7 is damaged by vapor HF, which fact results in a capacitive insulating film 7 of a satisfactory film quality.

Embodiment 4

Next, the fourth embodiment of the present invention will be described.

Figure 9:
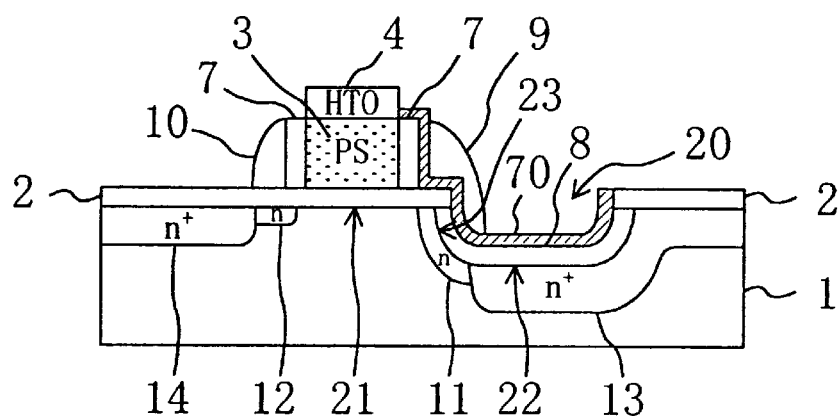
FIG. 9 is a cross-sectional view of a nonvolatile semiconductor memory device in the fourth embodiment of the present invention.

FIG. 9 shows the cross section of the nonvolatile semiconductor memory device of this embodiment. The device of the fourth embodiment is different from the device of the first embodiment in that a silicon oxide film, of which the silicon content is larger the content determined by the stoichiometry thereof (silicon rich oxide film), is formed on the capacitive insulating film 7 and the second gate insulating film 8 in this embodiment. In the other respects, the structure of this embodiment is the same as that of the first embodiment. Thus, the description of the common components of these embodiments will be omitted herein.

Next, a method for fabricating the device shown in FIG. 9 will be described with reference to FIGS. 10A and 10B and FIGS. 11A to 11C.

Figure 10A:
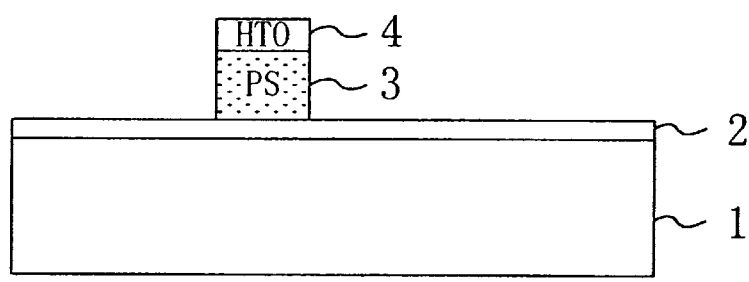
FIG. 10A and 10B are cross-sectional views showing the respective process steps for fabricating the nonvolatile semiconductor memory device in the fourth embodiment of the present invention.

First, as shown in FIG. 10A, the surface of the semiconductor substrate 1 made of p-type single crystalline silicon is thermally oxidized, thereby forming an insulating film having a thickness of about 13 nm to about 17 nm on the surface of the semiconductor substrate 1. This insulating film is a film (i.e., the first insulating film) including a portion ultimately functioning as the first gate insulating film 2. Next, after a poly-silicon thin film has been deposited by performing a CVD method, the poly-silicon thin film is patterned by utilizing a known lithography technique and a known dry etching technique, thereby forming the control gate 3 made of poly-silicon. Next, the surfaces (i.e., the sides and the upper surface) of the control gate 3 are oxidized, thereby forming a capacitive insulating film 7 having a thickness of about 18 nm to about 24 nm on the sides and the upper surface of the control gate 3.

Figure 10B:
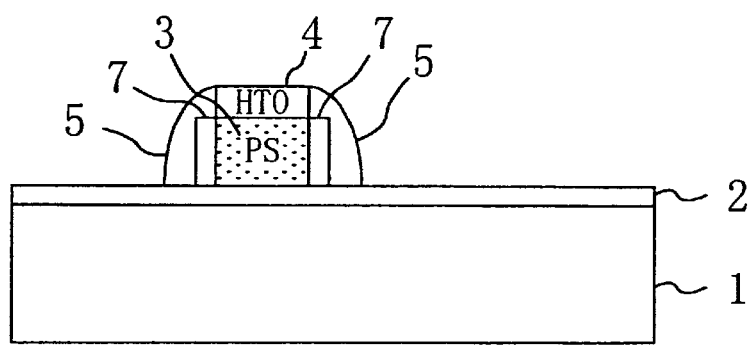

Thereafter, a BPSG film having a thickness of about 30 nm to about 70 nm is deposited over the entire surface of the substrate 1. Then, the BPSG film is etched back from the surface thereof, thereby forming side walls 5 of the BPSG film on the sidewall portions of the control gate 3 as shown in FIG. 10B. The thickness of the BPSG side walls 5 (i.e., the size measured in the direction vertical to the side of the control gate 3) is in the range from about 30 nm to about 60 nm.

Figure 11A:
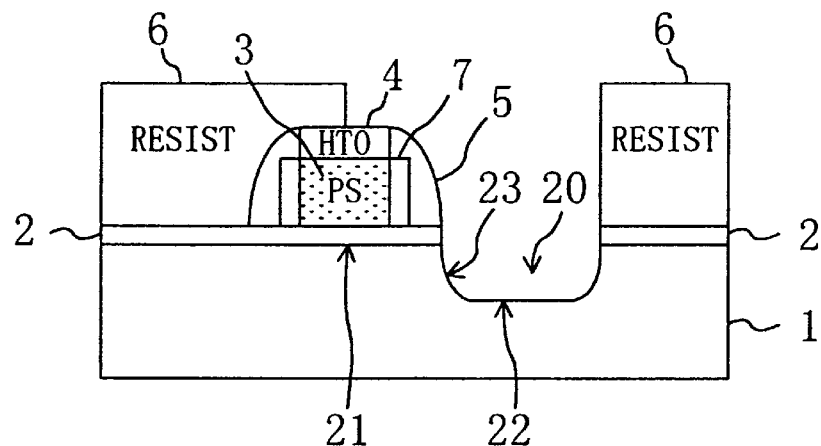
FIGS. 11A to 11C are cross-sectional views showing the respective process steps for fabricating the nonvolatile semiconductor memory device in the fourth embodiment of the present invention.

Next, as shown in FIG. 11A, a resist mask 6 is formed over the substrate 1 by utilizing a known lithography technique. Thereafter, by using the resist mask 6, the insulating cap 4 on the control gate 3 and the BPSG side wall 5 as a mask, the surface of the substrate 1 is partially etched, thereby forming a concave portion 20 having a depth of about 30 nm to about 50 nm in the surface of the substrate 1. By forming this concave portion 20, the surface of the substrate 1 is divided into the first surface region 21, the second surface region 22 and the step side region 23.

Figure 11B:
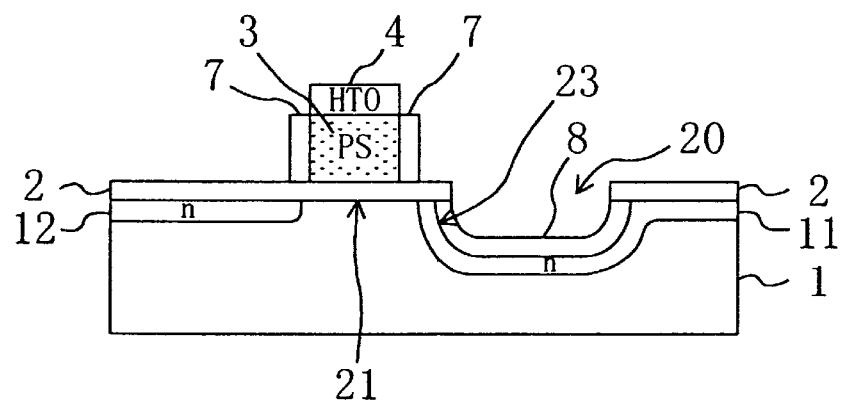
Figure 11C:
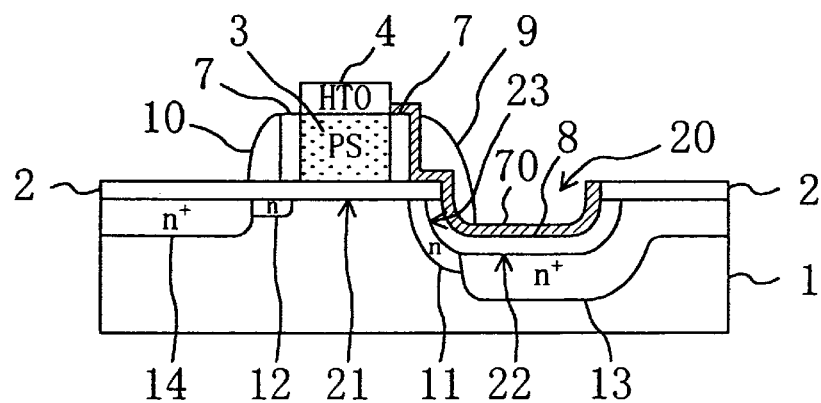

Next, the BPSG side walls 5 are selectively removed by using vapor HF, thereby forming the structure shown in FIG. 11B. Since the etching rate of the BPSG film by using vapor HF is 100 times or more as high as the etching rate of a thermally oxidized film (second gate oxide film), the capacitive insulating film 7 is hardly etched. Subsequently, the surface of the substrate 1 is thermally oxidized, thereby forming the second gate insulating film 8 having a thickness of about 7 nm to about 10 nm inside the concave portion 20 (i.e., in the second surface region 22 and the step side region 23). Then, n-type impurity ions are implanted into the surface of the substrate 1, thereby forming an n-type impurity diffusion layer including a part to function as the low-concentration drain region 11 and a part to function as the low-concentration source region 12.

Thereafter, a silicon oxide film, the silicon content of which is larger than the content determined by the stoichiometry thereof (silicon rich oxide film 70), is formed on the capacitive insulating film 7 and the second gate insulating film 8.

Next, a poly-silicon film having a thickness of about 150 nm to about 200 nm is deposited over the entire surface of the substrate 1 and then etched back from the surface thereof. By performing this etch-back process step, the poly-silicon film is partially left on the side wall portion of the control gate 3, thereby forming a sidewall-shaped floating gate 9. In this process step, a conductive side wall 10 is simultaneously formed with the floating gate 9. However, the conductive side wall 10 does not have particular effect on the operation of the nonvolatile memory.

Finally, by using the control gate 3, the floating gate 9 and the insulating side wall 10 as an implantation mask, arsenic ions are implanted into the surface of the substrate 1, thereby forming n-type high-concentration impurity layers 13 and 14 in the silicon substrate. As described above, the high-concentration impurity layer 13 becomes the high-concentration drain region and the high-concentration impurity layer 14 becomes the high-concentration source region.

If the silicon rich oxide film 70 is formed immediately after the capacitive insulating film 7 has been formed, then the silicon rich oxide film 70 is unintentionally oxidized during the formation of the second gate insulating film 8 by performing a thermal oxidization process. As a result, the silicon rich oxide film 70 becomes a common silicon oxide film. Thus, in the fabrication process of this embodiment, the silicon rich oxide film 70 is formed after the second gate insulating film 8 has been formed.

A multi-layer film in which the silicon rich oxide film 70 and a common silicon oxide film have been stacked can make FN tunneling current flow with a lower electric field intensity as compared with a common single-layer silicon oxide film. In this embodiment, the FN tunneling current is utilized for erasing data. In order to realize an erasure time in the range from about 0.1 $\mu$s to about 1.0 $\mu$s, the FN tunneling current is required to flow at a current density in the range from about $10^{-2}$ ampere/cm$^{-2}$ to about $10^{-1}$ ampere/cm$^{-2}$. If such an operation is to be realized by using a common (single-layer) silicon oxide film, an electric field having an intensity of about 10 V/cm to about 13 V/cm needs to be formed. In contrast, by using the multi-layer film in which the silicon rich oxide film 70 and a common silicon oxide film have been stacked, such an operation is sufficiently realized by applying an electric field having an intensity of about 6 V/cm to about 8 V/cm. Since data can be erased with such relatively low electric field intensity, the fatigues of an oxide film is small with respect to repetitive cycles of write and erase operations, thereby realizing a high reliability. Consequently, the maximum number of times of a rewrite operation can be increased.

Embodiment 5

Next, the fifth embodiment of the present invention will be described.

Figure 12:
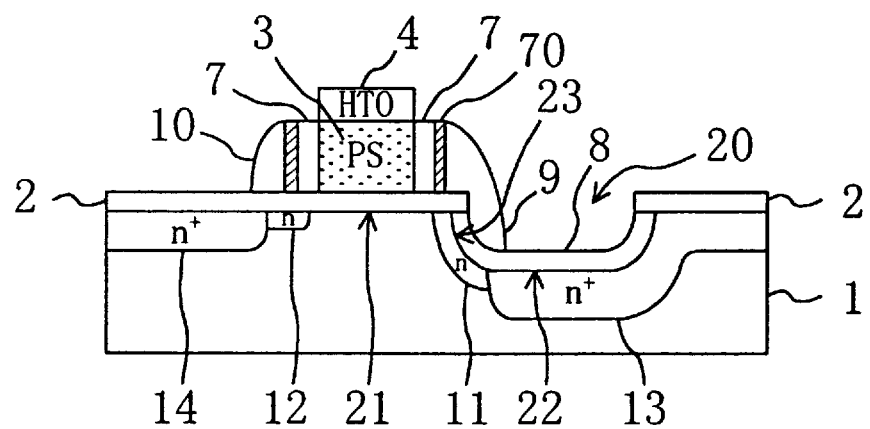
FIG. 12 is a cross-sectional view of a nonvolatile semiconductor memory device in the fifth embodiment of the present invention.

FIG. 12 shows the cross section of the nonvolatile semiconductor memory device of this embodiment. The device of the fifth embodiment is different from the device of the fourth embodiment in that the silicon rich oxide film is selectively formed only between the capacitive insulating film 7 and the floating gate 9 in this embodiment. In the other respects, the structure of this embodiment is the same as that of the fourth embodiment. Thus, the description of the common components of these embodiments will be omitted herein.

As described above, the multi-layer film in which silicon rich oxide film 70 and a common silicon oxide film have been stacked allows FN tunneling current to flow with a lower electric field intensity as compared with a common single-layer silicon oxide film. The FN tunneling current flows between a floating gate and a control gate when the electrons accumulated in the floating gate are taken out from the floating gate into the control gate. Thus, it is sufficient to form the silicon rich oxide film 70 between the capacitive insulating film 7 and the floating gate 9. On the other hand, if the silicon rich oxide film is formed on the second gate insulating film 8, the electric field intensity may be decreased during a data write operation or the amount of read current may be decreased. Thus, it is preferable that the silicon rich oxide film is not formed on the second gate insulating film 8.

In order to selectively form the silicon rich oxide film 70 only between the capacitive insulating film 7 and the floating gate 9, the following process steps are performed, for example. First, the silicon rich oxide film is deposited over the entire surface of the substrate 1. Thereafter, the majority of the silicon rich oxide film is removed by utilizing a highly anisotropic etching technique, thereby leaving only the part of the silicon rich oxide film deposited on a plane substantially vertical to the principal surface of the substrate. In this manner, the silicon rich oxide film can be selectively formed on the capacitive insulating film 7 having a surface substantially vertical to the principal surface of the substrate.

Figure 13:
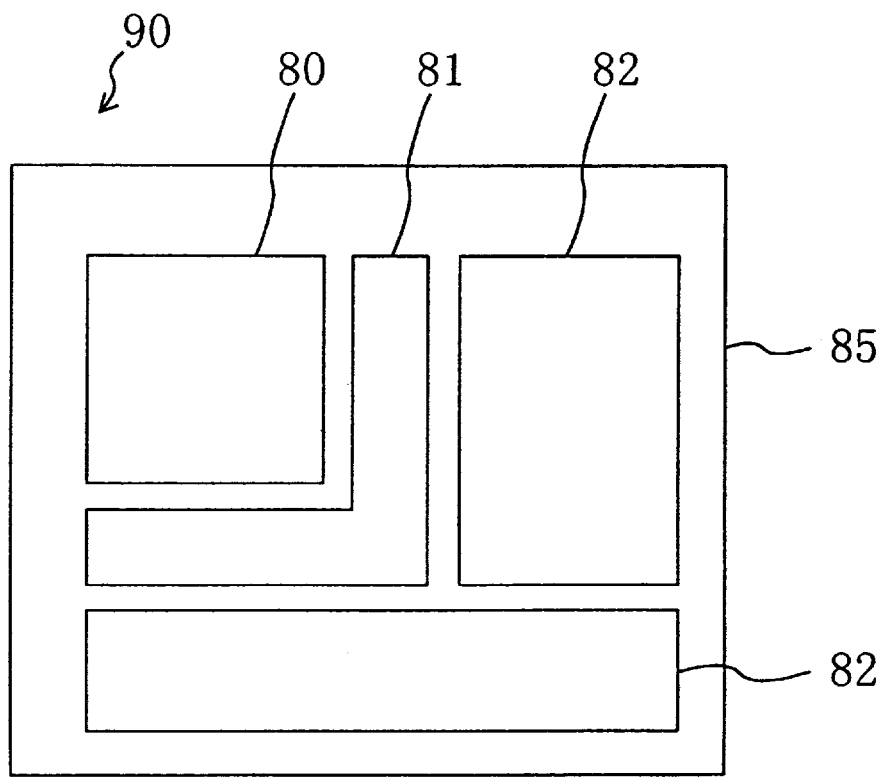
FIG. 13 is a block diagram showing a configuration of the semiconductor integrated circuit of the present invention.
Figure 14A:
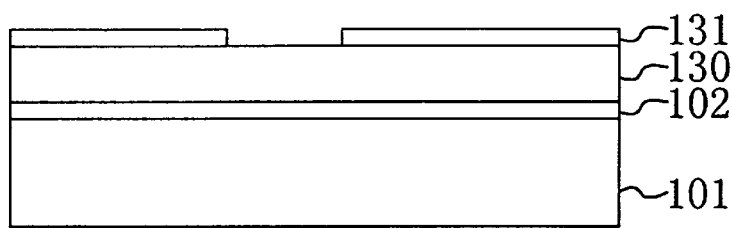
FIGS. 14A to 14D are cross-sectional views showing respective process steps for fabricating a conventional nonvolatile semiconductor memory device.
Figure 14B:
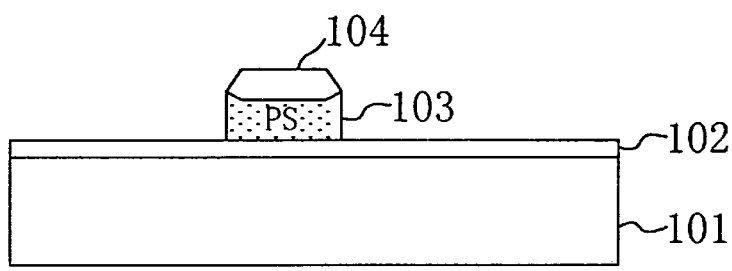
Figure 14C:
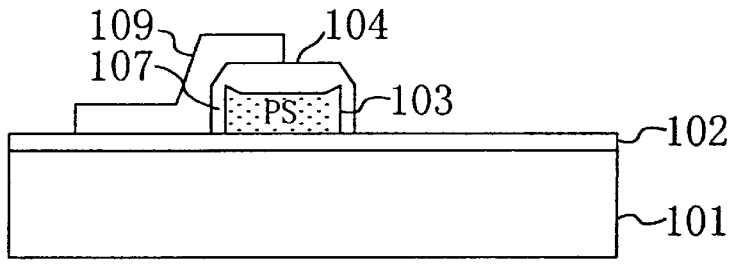
Figure 14D:
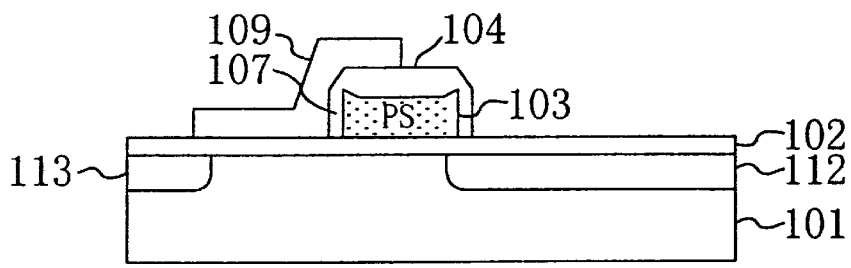

In the foregoing description, the present invention has been described as being applied to a nonvolatile semiconductor memory device. Hereinafter, an embodiment of the semiconductor integrated circuit of the present invention will be described with reference to FIG. 13.

The semiconductor integrated circuit 90 of this embodiment is a digital signal processor (DSP). The semiconductor integrated circuit 90 includes: a memory cell array section 80 including the nonvolatile semiconductor memory devices as nonvolatile memory cells in at least a part thereof; a peripheral circuit section 81 for driving the memory cell array section 80; and a processing circuit section 82 for performing digital signal processing on a common semiconductor chip 85. In the memory cell array section 80, a large number of nonvolatile memory cells are arranged in columns and rows. Each of the memory cells may have the configuration shown in FIGS. 1A and 1B or any other arbitrary configuration described in the other embodiments. Programs or data are stored in the memory array section 80. In accordance with the contents to be stored therein, at least one memory block including memory cells other than the nonvolatile memory cells may also be provided. The processing circuit section 82 is further divided into a plurality of function blocks (not shown). Since these blocks are composed of known processing circuit components such as control sections, arithmetic sections, multiplication sections, registers and the like, the detailed description thereof will be omitted herein. These components may be appropriately designed and arranged by those skilled in the art.

Since such a DSP includes the nonvolatile memories of the present invention in at least a part of the memory cell array section and the nonvolatile memory cells can perform the write of data at a high rate, it is possible to realize satisfactorily high-rate processing required for a DSP. In addition, according to the present invention, the power supply voltage required for operating the nonvolatile memories can be reduced while maintaining the write speed into the nonvolatile memories at a practical level. As a result, a single power supply can be commonly used for the processing circuit section and the nonvolatile memory cell array section, which would otherwise be impossible unless the nonvolatile semiconductor memory device of the present invention, which can write data at a high rate upon the application of a low voltage, is used.

The nonvolatile semiconductor memory device of the present invention uses a semiconductor substrate having a surface including a first surface region at a first level, a second surface region at a second level lower than the first level, and a step side region linking the first surface region and the second surface region together. The control gate is formed on a first gate insulating film portion formed in the first surface region. A part of the floating gate faces the step side region and another part of the floating gate is adjacent to the control gate. Thus, the direction of an electric field formed between the source and the drain matches with the direction in which the electrons are injected. As a result, the injection efficiency and a write speed can be considerably increased. In addition, since the floating gate is self aligned with the control gate, the effective channel length is close to a designed value and the variation in characteristics are very small.

The method for fabricating a nonvolatile semiconductor memory device of the present invention includes the steps of: covering a capacitive insulating film, which is located on sides of the control gate, with side walls; partially etching the insulating film and a surface of the semiconductor substrate by using the control gate and the side walls as a mask, thereby forming a concave portion in the surface of the semiconductor substrate; forming a second gate insulating film in the concave portion; and selectively removing the side walls. Thus, the side of the concave portion (i.e., the step side region) can be formed so as to be self-aligned with respect to the control gate. In addition, by adjusting the thickness of the side walls, the positional relationship between the edge of the control gate and the step side region can be precisely controlled with high reproducibility.

Moreover, the method further includes the step of forming a floating gate having a surface facing a side of the control gate via the capacitive insulating film and having a surface facing a side of the concave portion of the semiconductor substrate via the second gate insulating film. Thus, a structure, which can inject electrons with high efficiency, is realized.

Furthermore, the step of forming the floating gate includes the steps of: depositing a conductive thin film, which is to be a material of the floating gate, so as to cover the control gate and the concave portion of the semiconductor substrate, and etching back the conductive thin film by an anisotropic etching process, thereby leaving a part of the conductive thin film in a region adjacent to the side of the control gate. Thus, the floating gate can be formed so as to be self-aligned with respect to the control gate.

Furthermore, the insulating thin film to be the material of the side walls functioning as a part of the mask during the step of forming the concave portion in the semiconductor substrate is an oxide film containing boron and phosphorous. The step of selectively removing the side walls is performed by a vapor phase reaction involving fluorine. Thus, the side walls can be removed substantially without etching the capacitive insulating film formed on the sides of the control gate.

After the step of forming the second gate insulating film in the concave portion of the semiconductor substrate has been performed and before the step of forming the floating gate is performed, a silicon oxide film having a silicon content larger than the content determined by the stoichiometry thereof is formed. Then, since a larger amount of FN current flows between the floating gate and the control gate, data can be erased more easily.

The semiconductor integrated circuit of the present invention includes a nonvolatile semiconductor memory device, which realizes remarkably increased injection efficiency and write speed, as a nonvolatile memory cell, and thus can be operated at a higher rate. In addition, if the level of power required for operating the nonvolatile memory is reduced, then a device operating with a single power supply can be provided.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for fabricating a nonvolatile semiconductor memory device comprising the steps of:
    forming an insulating film including a portion functioning as a first gate insulating film on a substrate;
    forming a control gate on the portion of the insulating film functioning as the first gate insulating film, leaving a side of the control gate exposed;
    depositing a side-wall-forming film over exposed surfaces of the insulating film and the control gate, and etching the side-wall-forming film thereby forming a side wall comprising an oxide film containing boron and phosphorous, the side wall being formed in a self-alignment manner on a portion of a surface of the insulating film which is substantially flat so as to cover a side of the control gate;
    partially etching the insulating film and a surface of the substrate by using an etching material and by using at least the control gate and the side wall as a mask, thereby forming a concave portion in the surface of the substrate;
    removing the side wall;
    forming a capacitive insulating film on the side of the control gate, and forming a second gate insulating film in the concave portion; and
    forming a floating gate facing only the side of opposite sides of the control gate which is closest to the concave portion via the capacitive insulating film and facing a side of the concave portion of the substrate via the second gate insulating film.

2. A method for fabricating a nonvolatile semiconductor memory device according to claim 1,
    wherein the step of forming the floating gate comprises the steps of:
    depositing a conductive film, which is to be a material for the floating gate, so as to cover the control gate and the concave portion of the substrate, and
    etching back the conductive film by an anisotropic etching process, thereby leaving a part of the conductive film in a region adjacent to the side of the control gate.

3. A method for fabricating a nonvolatile semiconductor memory device according to claim 1,
    wherein the step of forming the side wall comprises the steps of:
    depositing another insulating film, which is to be a material for the side wall, so as to cover the control gate, and
    etching back said another insulating film by an anisotropic etching process, thereby leaving a part of said another insulating film in a region adjacent to the side of the control gate.

4. A method for fabricating a nonvolatile semiconductor memory device according to claim 1,
    wherein the step of forming the capacitive insulating film further comprises the step of oxidizing the side of the control gate, thereby covering a surface of the control gate with another oxide film.

5. A method for fabricating a nonvolatile semiconductor memory device according to claim 1,
    wherein another insulating film is formed on an upper surface of the control gate prior to the step of forming the capacitive insulating film.

6. A method for fabricating a nonvolatile semiconductor memory device according to claim 1,
    wherein the step of forming the second gate insulating film in the concave portion further comprises the step of oxidizing the side and a bottom of the concave portion and simultaneously oxidizing the side of the control gate.

7. A method for fabricating a nonvolatile semiconductor memory device according to claim 1,
    further comprising the step of forming the capacitive insulating film on an upper surface of the control gate simultaneously with the step of forming the capacitive insulating film on the side of the control gate,
    wherein the steps of forming the capacitive insulating film on the side and the upper surface of the control gate are performed prior to the step of forming the side wall.

* * * * *